United States Patent [19]

McAdams

[11] Patent Number: 4,621,346
[45] Date of Patent: Nov. 4, 1986

[54] LOW POWER CMOS FUSE CIRCUIT
[75] Inventor: Hugh P. McAdams, Houston, Tex.
[73] Assignee: Texas Instruments Incorporated, Dallas, Tex.
[21] Appl. No.: 652,378
[22] Filed: Sep. 20, 1984
[51] Int. Cl.$^4$ ............................................. G11C 13/00
[52] U.S. Cl. .................................. 365/227; 365/126; 365/96
[58] Field of Search ................. 365/174, 182, 96, 189, 365/228, 226, 227

[56] References Cited
U.S. PATENT DOCUMENTS
4,532,607 7/1985 Vehida .................................. 365/96

Primary Examiner—Terrell W. Fears
Attorney, Agent, or Firm—John G. Graham

[57] ABSTRACT

A fuse circuit as used in self-repairing memory devices or the like employs a CMOS inverter and a feedback transistor to provide zero static or standby current. The fuse is in series with the feedback transistor across the supply, and the CMOS inverter has as its input the node between the fuse and feedback transistor. The inverter output controls the gate of the feedback transistor, which is N-channel or P-channel, depending upon whether the circuit is connected for high or low voltage output.

9 Claims, 2 Drawing Figures

LOW POWER CMOS FUSE CIRCUIT

BACKGROUND OF THE INVENTION

This invention relates to semiconductor integrated circuit devices, and more particularly to fuse circuits of the type used in VLSI CMOS semiconductor memory devices or the like.

In self-repairing semiconductor memory devices, fuses are used to store the addresses of faulty locations, so redundant cells can be substituted. Or, the fuse may be used to generate an enabling signal. These fuses are usually polysilicon conductor strips that are selectively blown by an indexed laser beam. The enabling signal or address bit is required to be at one logic state when disabled and the opposite logic state when programmed or enabled, so there must be a circuit path from one power supply rail to the other. One technique used in prior devices to reduce power dissipation in these enabling fuses is to connect the fuse element in series with a long-channel, narrow-width MOS transistor so the static current is kept to a minimum. Another technique is to clock the gate of the MOS transistor so that power is reduced in proportion to the duty cycle of the clock. Both of these techniques consume in the order of microamps to tens of microamps of current for practical transistor dimensions. Since several of these fuse circuits are generally used in a typical memory device, the power dissipation caused by the fuse circuits becomes unacceptable, especially for situations where very low standby power is needed, usually where CMOS circuits are used.

It is therefore the principal object of this invention to provide improved fuse circuits exhibiting a low current drain for use in semiconductor integrated circuits such as memory or microcomputer devices, particularly CMOS devices with low standby power dissipation and minimum complexity.

SUMMARY OF THE INVENTION

In accordance with one embodiment of the invention, a fuse circuit as used in self-repairing memory devices or the like employs a CMOS inverter and a feedback transistor to provide zero static or standby current. The fuse is in series with the feedback transistor across the supply, and the CMOS inverter has as its input the node between the fuse and feedback transistor. The inverter output controls the gate of the feedback transistor, which is N-channel or P-channel, depending upon whether the circuit is connected for high or low voltage output.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
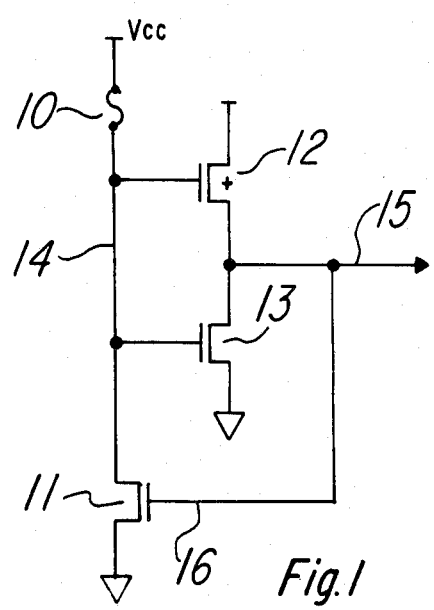
FIG. 1 is an electrical circuit diagram of a CMOS fuse circuit according to the invention.

Referring to FIG. 1, a fuse circuit constructed according to the invention is illustrated. A fuse element 10 is connected in series with an N-channel feedback transistor 11, and this series circuit is connected between a supply voltage Vcc and Vss. A CMOS inverter including a P-channel transistor 12 and an N-channel transistor 13 has the node 14 as an input and produces an output 15. Feedback is provided from the output node 15 to the gate of the transistor 11 by a line 16.

During power-up of the supply voltage Vcc, as Vcc goes from zero to +5 v, if the fuse has not been blown, the node 14 follows Vcc since the node 15 starts at Vss potential and the transistor 11 is off. Since the node 14 follows Vcc, the P-channel transistor 12 stays off. As soon as Vcc and node 14 reach the N-channel threshold voltage, Vtn, the transistor 13 turns on, holding the output node 15 at Vss. This quickly discharges to zero any capacitive coupling of voltage to the output node 15 at power-on due to the Vcc transition, and so the transistor 11 is held off. Thus the only current flowing through the fuse 10 from the Vcc supply is leakage current, on the order of nanoamps.

If the fuse 10 has been blown, as Vcc is powered up, node 14 is at Vss and the P-channel transistor 12 turns on as soon as its threshold Vtp is reached, causing the output node 15 to follow Vcc. Once the node 15 reaches the threshold Vtn, the transistor 11 turns on, keeping the node 14 at Vss. Any capacitive coupling of voltage to node 14 from the Vcc transition is quickly discharged. Should the coupling to node 14 be such as to cause it to closely track Vcc (an unlikely situation), it will nevertheless eventually discharge to Vss due to the junction leakage on the drain of the transistor 11, this junction leakage being several orders of magnitude greater than the oxide leakage of the transistor 12.

Figure 2:
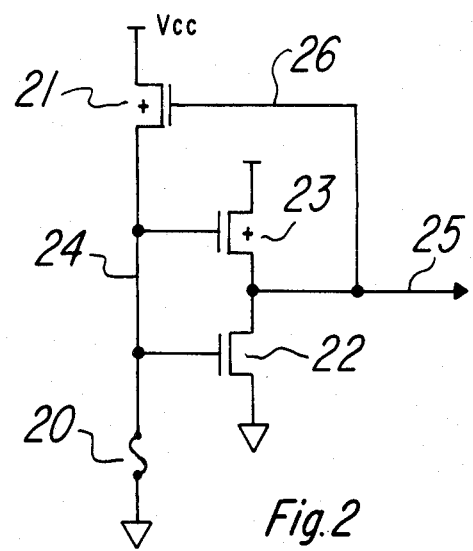
FIG. 2 is a circuit diagram like FIG. 1 according to another embodiment of the invention.

Should the opposite polarity be needed in the output, the circuit can be inverted in polarity by interchanging the Vss and Vcc supplies and exchanging the N-channel for P-channel and P-channel for N-channel transistors, as seen in FIG. 2. Operation is similar. That is, the fuse device 20 is connected in series with a P-channel transistor 21, and a CMOS inverter including N-channel transistor 22 and P-channel transistor 23 has the node 24 as its input and the node 25 as its output. The gate of the transistor 21 is connected to output node 25 by line 26. If the fuse has been blown, at power-on when Vcc goes high (to +5 v) the feedback transistor 21 is on since node 25 is initially at Vss. The node 24 follows Vcc and turns on the transistor 22 when Vtn is reached, thus holding the output node 25 at Vss and holding the feedback transistor 21 on. Thus the output stays at Vss. If the fuse 20 has not been blown, when Vcc is powered up the node 24 is clamped at Vss by the fuse 20, so the transistor 23 turns on when Vcc reaches Vtp, pulling the node 25 up to Vcc and turning off the transistor 21. The transistor 22 is held off since the fuse 20 holds the node 24 at Vss. The output therefore stays at Vcc.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A fuse circuit for a low-power semiconductor memory device or the like, comprising:

a fuse device which is selectively rendered conductive or non-conductive, a power supply having first and second terminals, an inverter circuit having first and second transistors of opposite conductivity type, each transistor having a source-drain path and a gate, the source-drain paths of the transistors being connected in series between said first and second terminals of the power supply, the gates being connected to an input node, the juncture of said source-drain paths providing an output node, a third transistor having a source-drain path connecting said input node to one of said first and second terminals of the power supply, and having a gate connected to said output node, said fuse device being connected between said input node and the other of the first and second terminals of said power supply.

2. A circuit according to claim 1 wherein said third transistor is N-channel.

3. A circuit according to claim 1 wherein said third transistor is P-channel.

4. A circuit according to claim 2 wherein said one of the first and second terminals of said power supply is a positive voltage and said other is ground.

5. A circuit according to claim 3 wherein said one of the first and second terminals of said power supply is ground and said other is a positive voltage.

6. A circuit according to claim 4 wherein said first transistor is P-channel and said second transistor is N-channel.

7. A circuit according to claim 5 wherein said first transistor is N-channel and said second transistor is P-channel.

8. A fuse circuit for a low-power semiconductor memory device or the like, comprising:

a fuse element which is selectively rendered conductive or non-conductive, a power supply having a first terminal at at positive voltage and a second terminal at ground potential, an inverter circuit having a first P-channel transistor and a second N-channel transistor, each of the first and second transistors having a source-drain path and a gate, the source-drain paths of the first and second transistors coupled to an input node, the juncture of said source-drain paths of the first and second transistors being coupled to an output node, a third N-channel transistor having a source-drain path coupling said input node to one of said second terminal of the power supply, and having a gate coupled to said output node, said fuse element being coupled between said input node and said second terminal of said power supply.

9. A fuse circuit for a low-power semiconductor memory device or the like, comprising:

a fuse element which is selectively rendered conductive or non-conductive, a power supply having a first terminal at a positive voltage and a second terminal at a ground potential, an inverter circuit having a first P-channel transistor and a second N-channel transistor, each of the first and second transistors having a source-drain path and a gate, the source-drain paths of the first and second transistors being connected in series between said first and second terminals of the power supply, the gates of the first and second transistors being coupled to an input node, the juncture of said source-drain paths of the first and second transistors being coupled to an output node, a third P-channel transistor having a source-drain path coupling said input node to said first terminal of the power supply, and having a gate coupled to said output node, said fuse element being coupled between said input node and said second terminal of said power supply.

* * * * *